US012745443B2

(12) United States Patent
Liu et al.

(10) Patent No.: US 12,745,443 B2
(45) Date of Patent: Sep. 22, 2026

(54) SEMICONDUCTOR TRANSISTOR STRUCTURE AND FABRICATION METHOD THEREOF

(71) Applicant: UNITED MICROELECTRONICS CORP., Hsin-Chu City (TW)

(72) Inventors: Kuan-Liang Liu, Hsinchu County (TW); Szu-Han Huang, New Taipei City (TW)

(73) Assignee: UNITED MICROELECTRONICS CORP., Hsin-Chu City (TW)

( * ) Notice: Subject to any disclaimer, the term of this patent is extended or adjusted under 35 U.S.C. 154(b) by 415 days.

(21) Appl. No.: 18/420,724

(22) Filed: Jan. 23, 2024

(65) Prior Publication Data

US 2025/0227979 A1 Jul. 10, 2025

(30) Foreign Application Priority Data

Jan. 5, 2024 (TW) ................................ 113100554

(51) Int. Cl.

| | |
|---|---|
| ***H10D 64/27*** | (2025.01) |
| ***H10D 30/60*** | (2025.01) |
| ***H10D 30/62*** | (2025.01) |
| ***H10D 64/01*** | (2025.01) |
| ***H10P 14/60*** | (2026.01) |
| ***H10P 76/40*** | (2026.01) |
| ***H10W 10/00*** | (2026.01) |
| ***H10W 10/17*** | (2026.01) |
| ***H10W 20/00*** | (2026.01) |
| ***H10W 20/44*** | (2026.01) |
| ***H10W 20/48*** | (2026.01) |

(52) U.S. Cl.
CPC ....... *H10D 64/512* (2025.01); *H10P 14/6506* (2026.01); *H10W 10/014* (2026.01); *H10W 10/17* (2026.01); *H10W 20/069* (2026.01); *H10W 20/4441* (2026.01); *H10W 20/48* (2026.01)

(58) Field of Classification Search
CPC ............. H10W 20/48; H10W 20/4441; H10W 20/069; H10W 10/17; H10W 10/014; H10P 14/6506; H10D 30/60; H10D 30/62; H10D 64/518; H10D 64/017
See application file for complete search history.

(56) References Cited

U.S. PATENT DOCUMENTS 10,068,892 B2 9/2018 Hwang
2015/0118835 A1* 4/2015 Lin ..................... H10D 30/021 438/586

(Continued)

*Primary Examiner* — Mohsen Ahmadi
(74) *Attorney, Agent, or Firm* — Winston Hsu

(57) ABSTRACT

A semiconductor transistor structure includes a semiconductor substrate having an active area and a trench isolation region surrounding the active area; a first inter-layer dielectric (ILD) layer covering the semiconductor substrate; a metal gate embedded in the first ILD layer and overlying the active area and the trench isolation region, wherein the metal gate comprises a first portion disposed directly above the active area and a second portion disposed directly above the trench isolation region, wherein the first portion is thicker than the second portion; a hard mask layer disposed on the second portion; and a gate dielectric layer disposed between the first portion of the metal gate and the active area.

16 Claims, 6 Drawing Sheets

(56) References Cited

U.S. PATENT DOCUMENTS

2015/0145057 A1* 5/2015 Fan ...................... H10D 64/517
257/369
2016/0013104 A1* 1/2016 Hung .................. H10W 20/069
257/288
2017/0040179 A1* 2/2017 Liao .................... H10W 20/069
2017/0069528 A1* 3/2017 Huang .................... H10P 50/73

* cited by examiner

SEMICONDUCTOR TRANSISTOR STRUCTURE AND FABRICATION METHOD THEREOF

BACKGROUND OF THE INVENTION

1. Field of the Invention

The present invention relates to the field of semiconductor technology, and in particular, to an improved semiconductor transistor structure and a manufacturing method thereof.

2. Description of the Prior Art

The metal gate (MG) height composed of complicated work function metal (WFM) films is crucial to the device and yield performance at the FinFET Technology. The parasitic capacitance between MGs and conductors gets increased with the increasing MG height while a disproportional relation is found between the channel resistance and MG height. There is a constant need in this industry to improve the MG height uniformity.

SUMMARY OF THE INVENTION

It is one object of the present invention to provide an improved semiconductor transistor structure and a manufacturing method thereof to solve the deficiencies or shortcomings of the existing technology.

One aspect of the invention provides a semiconductor transistor structure including a semiconductor substrate having an active area and a trench isolation region surrounding the active area; a first inter-layer dielectric (ILD) layer covering the semiconductor substrate; a metal gate embedded in the first ILD layer and overlying the active area and the trench isolation region, wherein the metal gate comprises a first portion disposed directly above the active area and a second portion disposed directly above the trench isolation region, wherein the first portion is thicker than the second portion; hard mask layer disposed on the second portion of the metal gate; and gate dielectric layer disposed between the first portion of the metal gate and the active area.

According to some embodiments, the hard mask layer comprises a silicon nitride layer.

According to some embodiments, the metal gate comprises a metal filling layer and a work function metal (WFM) layer.

According to some embodiments, the metal filling layer comprises a tungsten layer.

According to some embodiments, the hard mask layer is in direct contact with the metal filling layer.

According to some embodiments, the hard mask layer has a top surface that is coplanar with a top surface of the first portion of the metal gate.

According to some embodiments, the semiconductor transistor structure further includes a source doping region disposed on a first side of the metal gate; and a drain doping region disposed on an opposing second side of the metal gate.

According to some embodiments, the semiconductor transistor structure further includes a second inter-layer dielectric (ILD) layer covering the first ILD layer, the hard mask layer, and the metal gate; and a contact plug embedded in the second ILD layer and extending into the hard mask layer to electrically contact with the second portion of the metal gate.

According to some embodiments, the contact plug comprises tungsten.

According to some embodiments, the second portion of the metal gate has a width greater than or equal to 0.07 micrometers.

Another aspect of the invention provides a method of forming a semiconductor transistor structure. A semiconductor substrate having an active area and a trench isolation region surrounding the active area is provided. A first inter-layer dielectric (ILD) layer is formed on the semiconductor substrate. A metal gate is formed. The metal gate is embedded in the first ILD layer and overlies the active area and the trench isolation region. The metal gate comprises a first portion disposed directly above the active area and a second portion disposed directly above the trench isolation region. The first portion is thicker than the second portion. A hard mask layer is formed on the second portion of the metal gate. A gate dielectric layer is formed between the first portion of the metal gate and the active area.

According to some embodiments, the hard mask layer comprises a silicon nitride layer.

According to some embodiments, the metal gate comprises a metal filling layer and a work function metal (WFM) layer.

According to some embodiments, the metal filling layer comprises a tungsten layer.

According to some embodiments, the hard mask layer is in direct contact with the metal filling layer.

According to some embodiments, the hard mask layer has a top surface that is coplanar with a top surface of the first portion of the metal gate.

According to some embodiments, the method further includes the steps of forming a source doping region on a first side of the metal gate; and forming a drain doping region on an opposing second side of the metal gate.

According to some embodiments, the method further includes the steps of forming a second inter-layer dielectric (ILD) layer covering the first ILD layer, the hard mask layer, and the metal gate; and forming a contact plug embedded in the second ILD layer and extending into the hard mask layer to electrically contact with the second portion of the metal gate.

According to some embodiments, the contact plug comprises tungsten.

According to some embodiments, the second portion of the metal gate has a width greater than or equal to 0.07 micrometers.

These and other objectives of the present invention will no doubt become obvious to those of ordinary skill in the art after reading the following detailed description of the preferred embodiment that is illustrated in the various figures and drawings.

DETAILED DESCRIPTION

In the following detailed description of the disclosure, reference is made to the accompanying drawings, which form a part hereof, and in which is shown, by way of illustration, specific embodiments in which the invention may be practiced. These embodiments are described in sufficient detail to enable those skilled in the art to practice the invention.

Other embodiments may be utilized, and structural, logical, and electrical changes may be made without departing from the scope of the present invention. Therefore, the following detailed description is not to be considered as limiting, but the embodiments included herein are defined by the scope of the accompanying claims.

Figure 1:
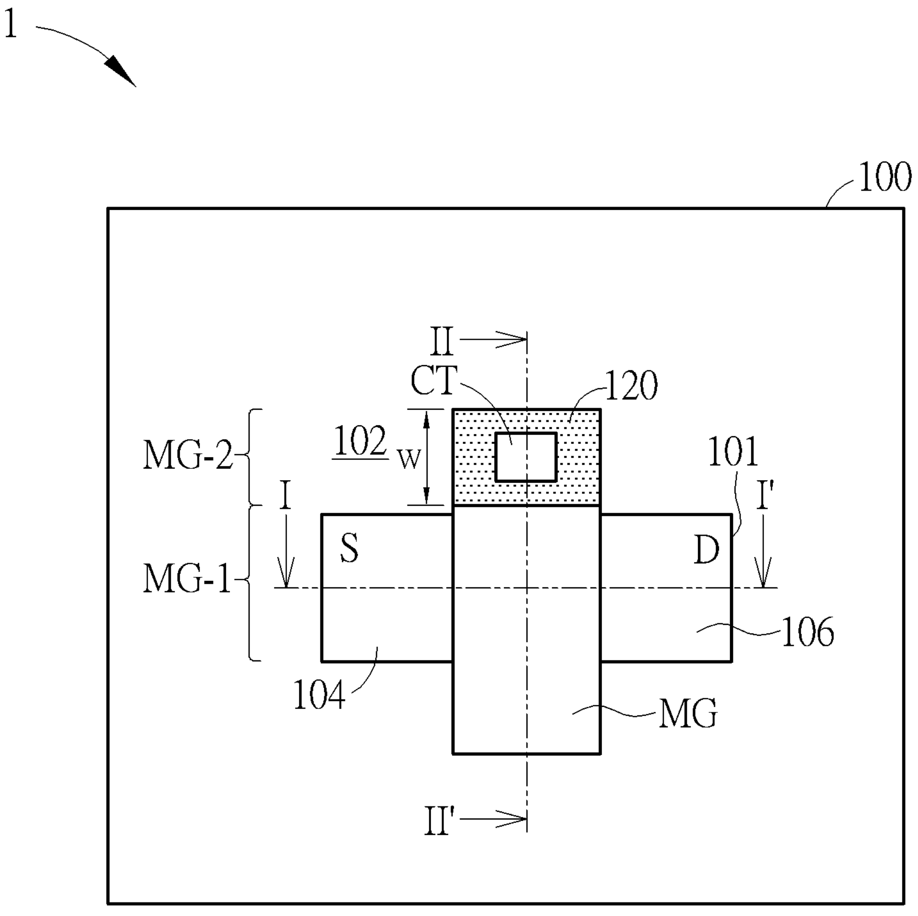
FIG. 1 is a top view of a semiconductor transistor structure according to an embodiment of the present invention.
Figure 2:
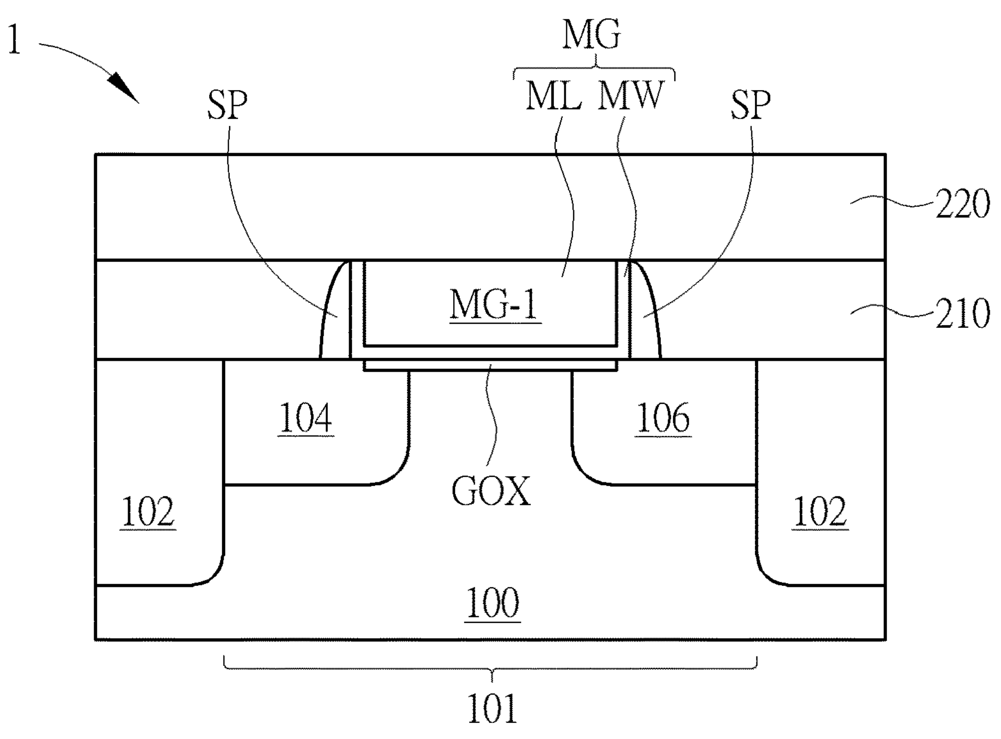
FIG. 2 is a schematic cross-sectional view taken along line I-I' in FIG. 1.
Figure 3:
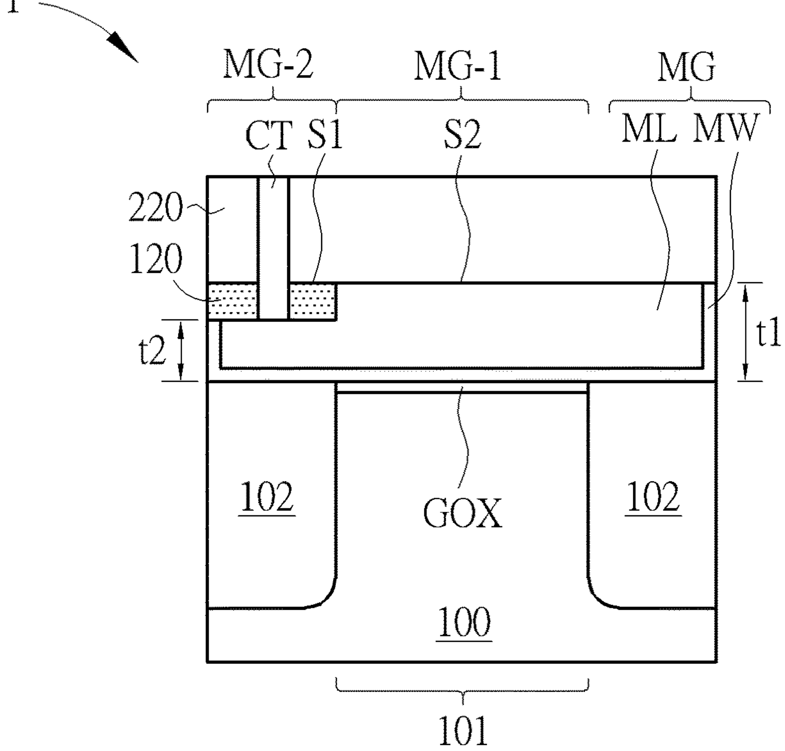
FIG. 3 is a schematic cross-sectional view taken along line II-II' in FIG. 1.

Please refer to FIG. 1 to FIG. 3, wherein FIG. 1 is a top view of a semiconductor transistor structure according to an embodiment of the present invention, FIG. 2 is a schematic cross-sectional view taken along line I-I' in FIG. 1, and FIG. 3 is a schematic cross-sectional view taken along line II-II' in FIG. 1. As shown in FIG. 1 to FIG. 3, the semiconductor transistor structure 1 includes a semiconductor substrate 100 having an active area 101 and a trench isolation region 102 surrounding the active area 101. According to an embodiment of the present invention, for example, the semiconductor transistor structure 1 may be a medium-voltage or high-voltage transistor element. According to an embodiment of the present invention, for example, the semiconductor substrate 100 may include a silicon substrate, but is not limited thereto. According to an embodiment of the present invention, for example, the active area 101 may be a strip-shaped area and may extend along the first direction D1. According to an embodiment of the present invention, for example, the trench isolation region 102 may include a shallow trench isolation structure.

As shown in FIG. 2, the semiconductor transistor structure 1 further includes a first interlayer dielectric (ILD) layer 210 covering the semiconductor substrate 100. According to an embodiment of the present invention, for example, the first ILD layer 210 may include silicon oxide, but is not limited thereto.

As shown in FIG. 1 to FIG. 3, the semiconductor transistor structure 1 further includes a metal gate MG embedded in the first ILD layer 210 and covering part of the active area 101 and part of the trench isolation region 102. The metal gate MG may be formed in the first ILD layer 210 using a replacement metal gate (RMG) process. According to an embodiment of the present invention, for example, the metal gate MG may be elongated and extend along the second direction D2 across the active area 101 so that both ends of the metal gate MG are located directly above the trench isolation region 102. According to an embodiment of the present invention, the metal gate MG includes a metal filling layer ML and a work function metal (WFM) layer MW. According to an embodiment of the present invention, for example, the metal filling layer ML may include a tungsten layer, but is not limited thereto.

Those familiar with this art should understand that the metal gate MG may further include a barrier layer, a high dielectric constant material layer, etc. For the sake of simplicity, these detailed structures are not shown in the figures.

As shown in FIG. 2, the semiconductor transistor structure 1 may include spacer SP between the first ILD layer 210 and the metal gate MG.

According to an embodiment of the present invention, the metal gate MG includes a first portion MG-1 disposed directly above the active area 101 and a second portion MG-2 disposed directly above the trench isolation region 102. The first portion MG-1 is directly connected to the second portion MG-2. As shown in FIG. 3, according to an embodiment of the present invention, the first portion MG-1 is thicker than the second portion MG-2. According to an embodiment of the present invention, for example, the ratio t2/t1 of the thickness t2 of the second portion MG-2 to the thickness t1 of the first portion MG-1 may be between 0.25-0.75. According to an embodiment of the present invention, for example, the thickness t1 of the first portion MG-1 may be between 250-600 angstroms, and the thickness t2 of the second portion MG-2 may be between 100-450 angstroms. As shown in FIG. 1, according to an embodiment of the present invention, the width w of the second portion MG-2 of the metal gate MG in the second direction D2 is greater than or equal to 0.07 micrometers.

As shown in FIG. 1 and FIG. 3, the semiconductor transistor structure 1 further includes a self-aligned contact (SAC) hard mask layer 120 disposed directly above the second portion MG-2. According to an embodiment of the present invention, the SAC hard mask layer 120 directly contacts the second portion MG-2. According to an embodiment of the present invention, the SAC hard mask layer 120 directly contacts the metal filling layer ML. According to an embodiment of the present invention, the top surface S1 of the SAC hard mask layer 120 is coplanar with the top surface S2 of the first portion MG-1 of the metal gate MG. According to an embodiment of the present invention, for example, the SAC hard mask layer 120 may include a silicon nitride layer, but is not limited thereto.

As shown in FIG. 2 and FIG. 3, the semiconductor transistor structure 1 further includes a gate dielectric layer GOX, which is disposed between the first portion MG-1 of the metal gate MG and the active area 101. According to an embodiment of the present invention, for example, the gate dielectric layer GOX may include silicon oxide, but is not limited thereto.

As shown in FIG. 1 and FIG. 2, according to an embodiment of the present invention, the semiconductor transistor structure 1 further includes a source doping region 104 disposed in the active area 101 on the first side of the metal gate MG, and a drain doping region 106 disposed in the active area 101 on the opposing second side of the metal gate MG. Those skilled in the art should understand that dopants may be implanted into the source doping region 104 and the drain doping region 106, and an epitaxial layer may also be formed.

As shown in FIG. 2 and FIG. 3, according to an embodiment of the present invention, the semiconductor transistor structure 1 further includes a second interlayer dielectric (ILD) layer 220 covering the first ILD layer 210, the SAC hard mask layer 120 and the metal gate MG. According to an embodiment of the present invention, for example, the second ILD layer 220 may be a low dielectric constant material layer or an ultra-low dielectric constant material layer.

As shown in FIG. 3, according to an embodiment of the present invention, the semiconductor transistor structure 1 further includes a contact plug CT, which is embedded in the second ILD layer 220 and extends into the SAC hard mask layer 120 to electrically connect with the second portion MG-2 of the metal gate MG. According to an embodiment of the present invention, the contact plug CT may include tungsten, but is not limited thereto.

Figure 4:
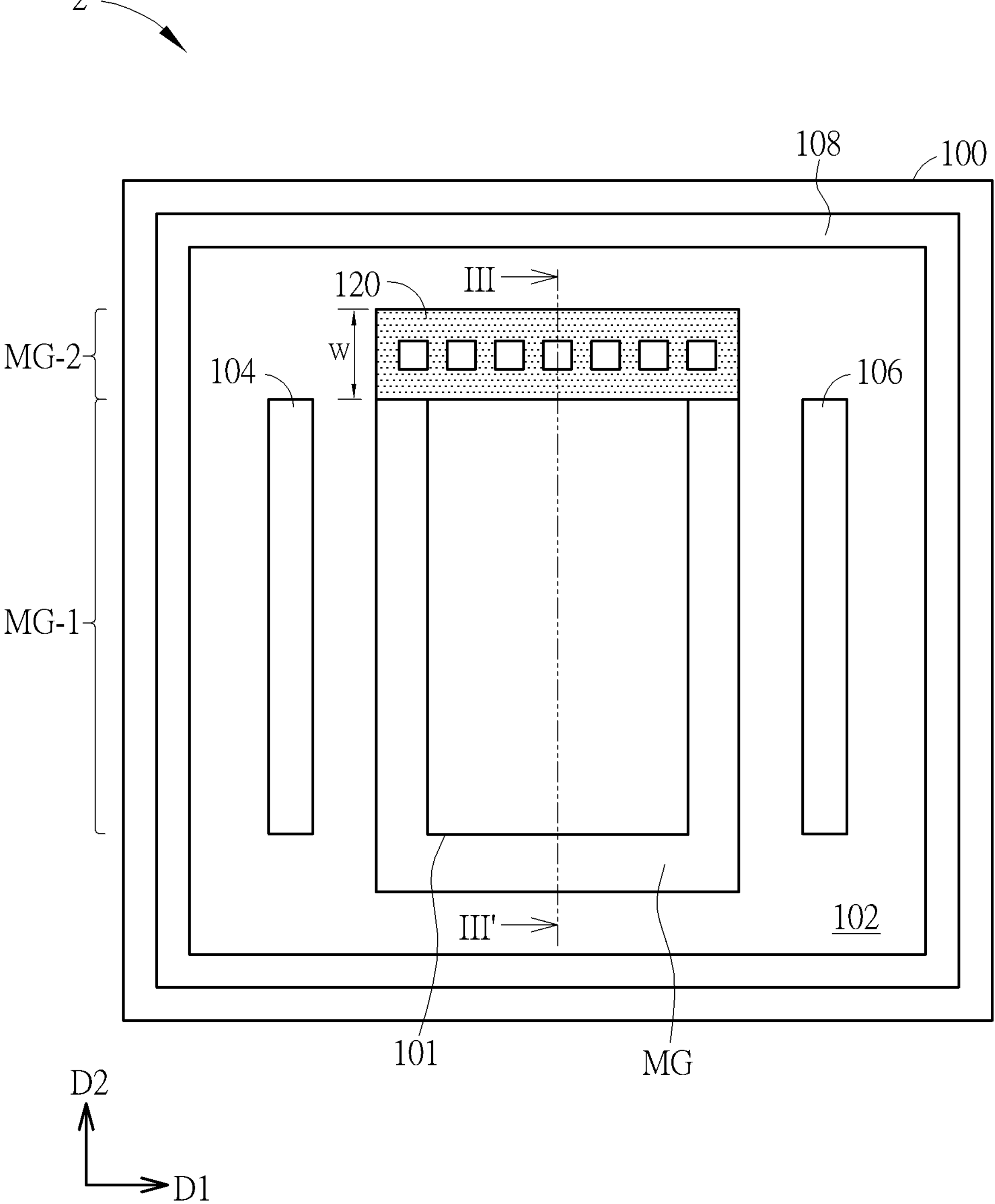
FIG. 4 is a top view of a semiconductor transistor structure according to another embodiment of the present invention.
Figure 5:
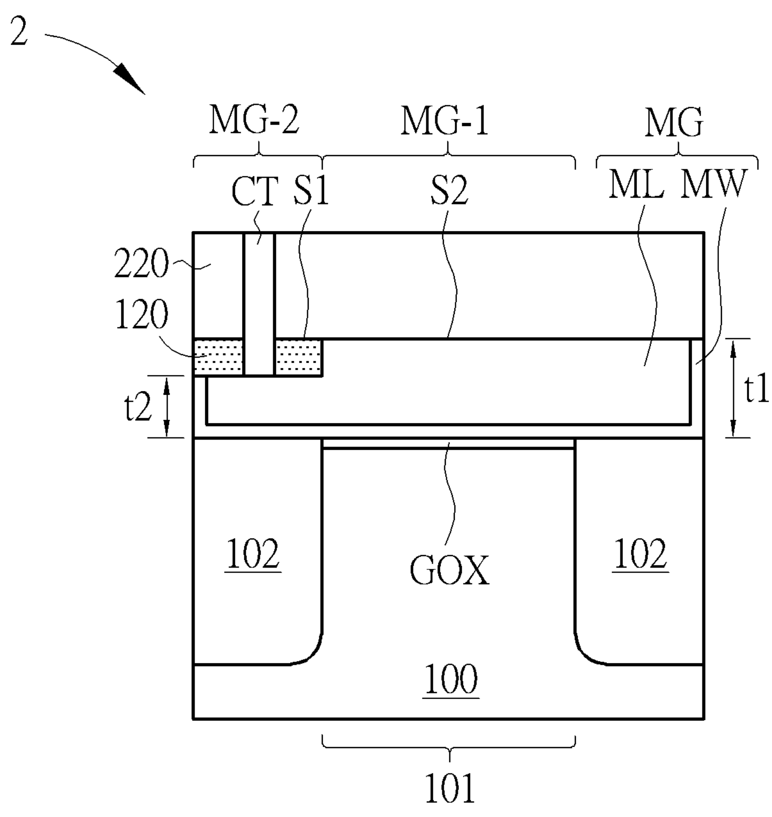
FIG. 5 is a schematic cross-sectional view taken along line III-III' in FIG. 4.

Please refer to FIG. 4 to FIG. 5, wherein FIG. 4 is a top view of a semiconductor transistor structure according to another embodiment of the present invention, and FIG. 5 is a schematic cross-sectional view taken along line III-III' in FIG. 4, wherein like layers, materials, or elements are designated by like numeral numbers or labels. As shown in FIG. 4 and FIG. 5, the semiconductor transistor structure 2 includes a semiconductor substrate 100 having an active area 101 and a trench isolation region 102 surrounding the active area 101. According to an embodiment of the present invention, for example, the semiconductor transistor structure 2 may be a high-voltage transistor element or a high-voltage laterally-diffused metal-oxide-semiconductor (LDMOS) element. According to an embodiment of the present invention, for example, the semiconductor substrate 100 may include a silicon substrate, but is not limited thereto. According to an embodiment of the present invention, for example, the active area 101 may be a strip-shaped area and may extend along the first direction D1. According to an embodiment of the present invention, for example, the trench isolation region 102 may include a shallow trench isolation structure.

As shown in FIG. 5, likewise, the semiconductor transistor structure 2 includes a first ILD layer 210 covering the semiconductor substrate 100. According to an embodiment of the present invention, for example, the first ILD layer 210 may include silicon oxide, but is not limited thereto.

As shown in FIG. 4 and FIG. 5, the semiconductor transistor structure 2 also includes a metal gate MG embedded in the first ILD layer 210 and covering part of the active area 101 and part of the trench isolation region 102. The metal gate MG may be formed in the first ILD layer 210 using a replacement metal gate (RMG) process. According to an embodiment of the present invention, for example, the metal gate MG may be elongated and extend along the second direction D2 across the active area 101 so that both ends of the metal gate MG are located directly above the trench isolation region 102. According to an embodiment of the present invention, as shown in FIG. 5, the metal gate MG includes a metal filling layer ML and a work function metal layer MW. According to an embodiment of the present invention, for example, the metal filling layer ML may include a tungsten layer, but is not limited thereto.

Those familiar with this art should understand that the metal gate MG may further include a barrier layer, a high dielectric constant material layer, etc. For the sake of simplicity, these detailed structures are not shown in the figures.

According to an embodiment of the present invention, the metal gate MG includes a first portion MG-1 disposed directly above the active area 101 and a second portion MG-2 disposed directly above the trench isolation region 102. The first portion MG-1 is directly connected to the second portion MG-2. As shown in FIG. 5, according to an embodiment of the present invention, the first portion MG-1 is thicker than the second portion MG-2. According to an embodiment of the present invention, for example, the ratio t2/t1 of the thickness t2 of the second portion MG-2 to the thickness t1 of the first portion MG-1 may be between 0.25-0.75. According to an embodiment of the present invention, for example, the thickness t1 of the first portion MG-1 may be between 250-600 angstroms, and the thickness t2 of the second portion MG-2 may be between 100-450 angstroms. As shown in FIG. 4, according to an embodiment of the present invention, the width w of the second portion MG-2 of the metal gate MG in the second direction D2 is greater than or equal to 0.07 micrometers.

As shown in FIG. 4 and FIG. 5, likewise, the semiconductor transistor structure 2 includes a SAC hard mask layer 120, which is disposed directly above the second portion MG-2. According to an embodiment of the present invention, the SAC hard mask layer 120 directly contacts the second portion MG-2. According to an embodiment of the present invention, the SAC hard mask layer 120 directly contacts the metal filling layer ML. According to an embodiment of the present invention, the top surface S1 of the SAC hard mask layer 120 is coplanar with the top surface S2 of the first portion MG-1 of the metal gate MG. According to an embodiment of the present invention, for example, the SAC hard mask layer 120 may include a silicon nitride layer, but is not limited thereto.

As shown in FIG. 5, the semiconductor transistor structure 2 also includes a gate dielectric layer GOX, which is disposed between the first portion MG-1 of the metal gate MG and the active area 101. According to an embodiment of the present invention, for example, the gate dielectric layer GOX may include silicon oxide, but is not limited thereto.

As shown in FIG. 4, according to an embodiment of the present invention, the semiconductor transistor structure 2 further includes a source doping region 104, which is disposed in the active area 101 on the first side of the metal gate MG, and a drain doping region 106 disposed in the active area 101 on the opposing second side of the metal gate MG. Those skilled in the art should understand that dopants may be implanted into the source doping region 104 and the drain doping region 106, and an epitaxial layer may also be formed. According to an embodiment of the present invention, the active area 101, the source doping region 104 and the drain doping region 106 may be surrounded by a protective seal ring region 108.

As shown in FIG. 5, according to an embodiment of the present invention, the semiconductor transistor structure 2 further includes a second interlayer dielectric (ILD) layer 220 covering the first ILD layer 210, the SAC hard mask layer 120 and the metal gate MG. According to an embodiment of the present invention, for example, the second ILD layer 220 may be a low dielectric constant material layer or an ultra-low dielectric constant material layer. According to an embodiment of the present invention, the semiconductor transistor structure 2 further includes a contact plug CT embedded in the second ILD layer 220 and extending into the SAC hard mask layer 120 to electrically connect with the second portion MG-2 of the metal gate MG. According to an embodiment of the present invention, the contact plug CT may include tungsten, but is not limited thereto.

Figure 6:
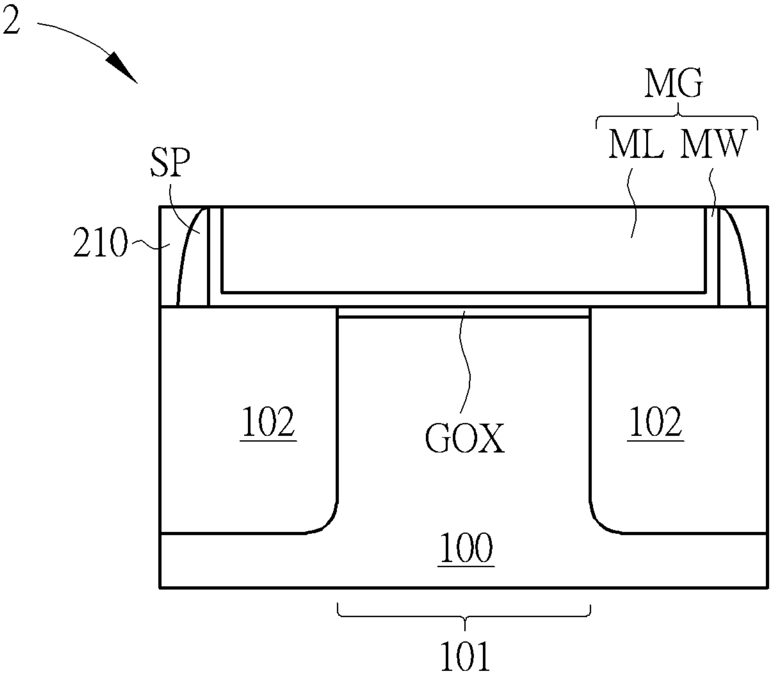
FIG. 6 to FIG. 10 are schematic diagrams of a method of forming a semiconductor transistor structure according to an embodiment of the present invention.

Please refer to FIG. 6 to FIG. 10, which are schematic diagrams of a method of forming a semiconductor transistor structure according to an embodiment of the present invention. To simplify the description, only the cross section along line II-II' in FIG. 1 is used for illustration. As shown in FIG. 6, a semiconductor substrate 100 having an active area 101 and a trench isolation region 102 surrounding the active area 101 is provided. According to an embodiment of the present invention, for example, the semiconductor substrate 100 may include a silicon substrate, but is not limited thereto. According to an embodiment of the present invention, for example, the trench isolation region 102 may include a shallow trench isolation structure. A first ILD layer 210 is formed on the semiconductor substrate 100. According to an embodiment of the present invention, for example, the first ILD layer 210 may include silicon oxide, but is not limited thereto.

Subsequently, a replacement metal gate (RMG) process is performed to form a metal gate MG in the first ILD layer 210. The metal gate MG is embedded in the first ILD layer 210 and covers part of the active area 101 and part of the trench isolation region 102. According to an embodiment of the present invention, the metal gate MG spans the active area 101 so that both ends of the metal gate MG are located directly above the trench isolation region 102. According to an embodiment of the present invention, the metal gate MG includes a metal filling layer ML and a work function metal layer MW. According to an embodiment of the present invention, for example, the metal filling layer ML includes a tungsten layer, but is not limited thereto. The gate dielectric layer GOX is disposed between the first portion MG-1 of the metal gate MG and the active area 101. According to an embodiment of the present invention, for example, the gate dielectric layer GOX may include silicon oxide, but is not limited thereto.

According to an embodiment of the present invention, the metal gate MG includes a first portion MG-1 disposed directly above the active area 101 and a second portion MG-2 disposed directly above the trench isolation region 102. The first portion MG-1 is directly connected to the second portion MG-2.

Figure 7:
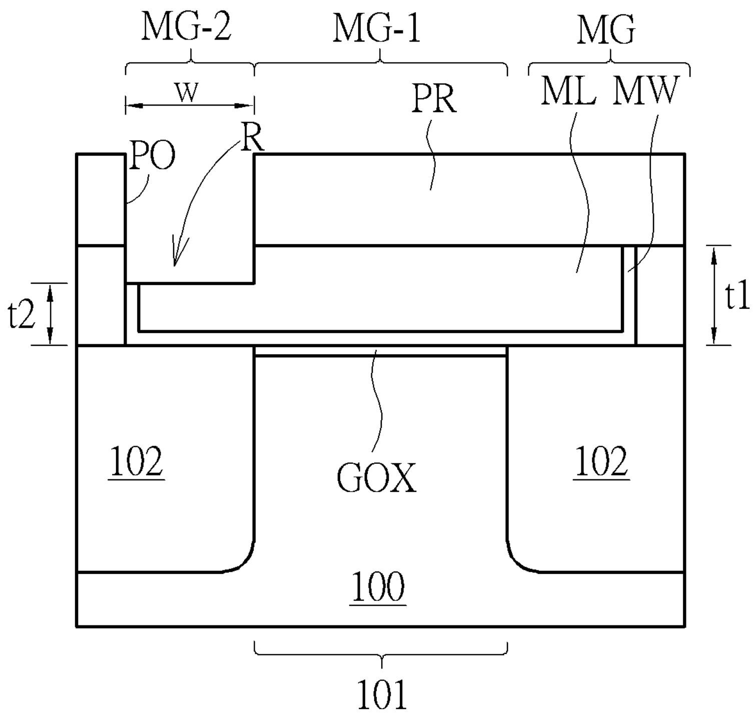

As shown in FIG. 7, a photolithography process is then performed to form a photoresist pattern PR on the first ILD layer 210 and the metal gate MG. The photoresist pattern PR includes the opening PO, exposing only the second portion MG-2 of the metal gate MG directly above the trench isolation region 102. According to an embodiment of the present invention, the width w of the opening PO is greater than or equal to 0.07 micrometers. An etching process is then performed to etch the second portion MG-2 with a partial thickness through the opening PO to form a recessed region R. At this point, the first portion MG-1 is thicker than the second portion MG-2. According to an embodiment of the present invention, for example, the ratio t2/t1 of the thickness t2 of the second portion MG-2 to the thickness t1 of the first portion MG-1 may be between 0.25-0.75. According to an embodiment of the present invention, for example, the thickness t1 of the first portion MG-1 may be between 250-600 angstroms, and the thickness t2 of the second portion MG-2 may be between 100-450 angstroms.

Figure 8:
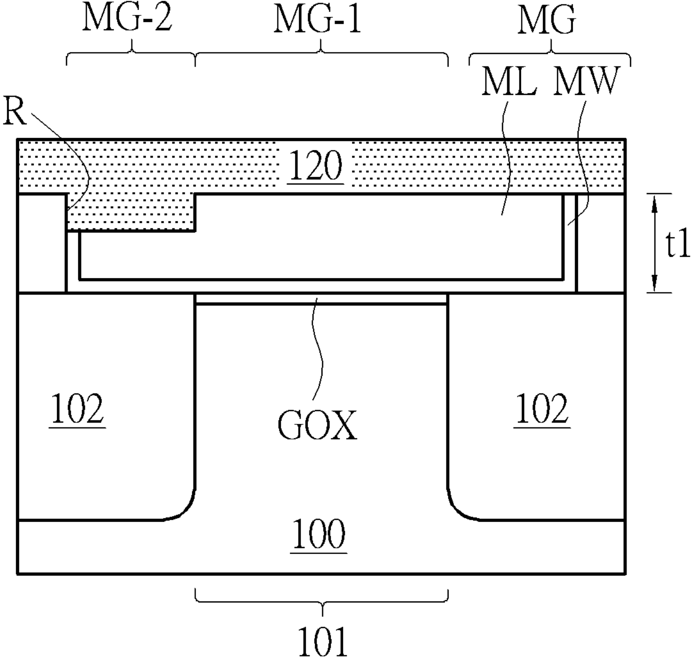

As shown in FIG. 8, a chemical vapor deposition (CVD) process is then performed to deposit a self-aligned contact (SAC) hard mask layer 120 on the semiconductor substrate 100 in a blanket manner, and recessed region R is filled with the SAC hard mask layer 120. According to an embodiment of the present invention, for example, the SAC hard mask layer 120 may include a silicon nitride layer, but is not limited thereto.

Figure 9:
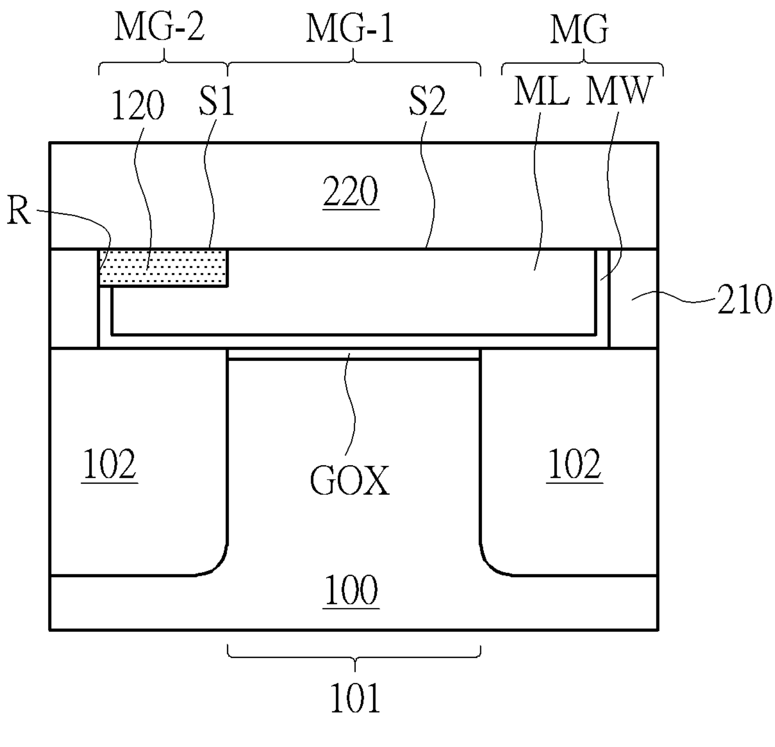

As shown in FIG. 9, a chemical mechanical polishing (CMP) process is then performed to remove the SAC hard mask layer 120 outside the recessed region R, leaving only the SAC hard mask directly above the second portion MG-2. According to an embodiment of the present invention, the SAC hard mask layer 120 directly contacts the second portion MG-2. According to an embodiment of the present invention, the SAC hard mask layer 120 directly contacts the metal filling layer ML. According to an embodiment of the present invention, the top surface S1 of the SAC hard mask layer 120 is coplanar with the top surface S2 of the first portion MG-1 of the metal gate MG. A chemical vapor deposition (CVD) process is then performed to deposit the second ILD layer 220 on the semiconductor substrate 100 in a blanket manner, so that the second ILD layer 220 covers the first ILD layer 210, the SAC hard mask layer 120 and the metal gate MG. According to an embodiment of the present invention, for example, the second ILD layer 220 may be a low dielectric constant material layer or an ultra-low dielectric constant material layer.

Figure 10:
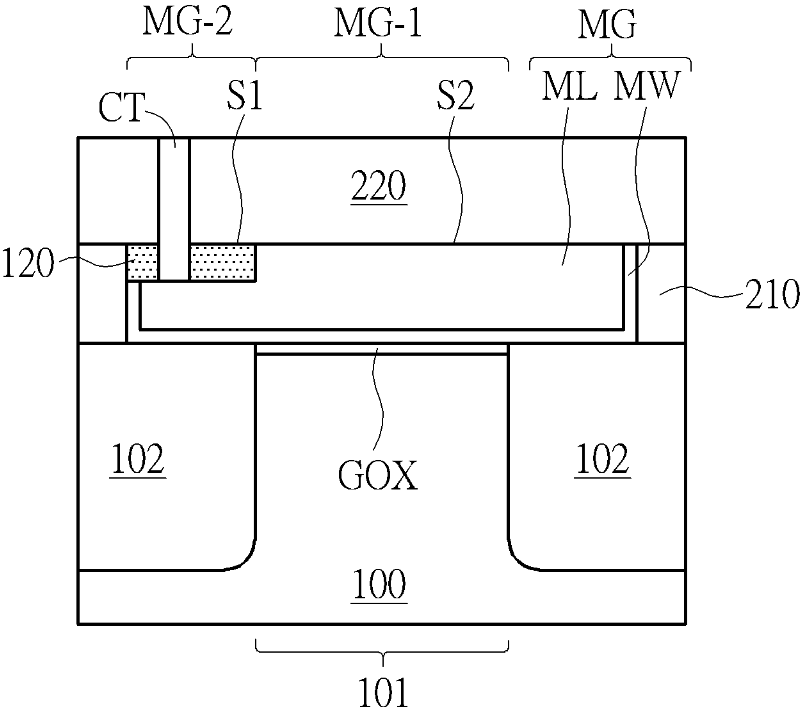

As shown in FIG. 10, a contact plug CT is then formed. The contact plug CT is embedded in the second ILD layer 220 and extends into the SAC hard mask layer 120 to electrically contact the second portion MG-2 of the metal gate MG. According to an embodiment of the present invention, the contact plug CT may include tungsten, but is not limited thereto.

Since the area of the medium-voltage or high-voltage transistor element covered by the SAC hard mask layer 120 is reduced to the smaller region that is directly above the second portion MG-2 of the metal gate MG, the process margin during the self-aligned contact formation in a large gate area can be significantly increased. The problem of over-etching of the work function metal layer of medium-voltage or high-voltage transistor elements during the SAC process can be solved, thereby improving the uniformity of metal gate height and improving device performance.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor transistor structure, comprising:

a semiconductor substrate having an active area and a trench isolation region surrounding the active area;

a first inter-layer dielectric (ILD) layer covering the semiconductor substrate;

a metal gate embedded in the first ILD layer and overlying the active area and the trench isolation region, wherein the metal gate comprises a first portion disposed directly above the active area and a second portion disposed directly above the trench isolation region, wherein the first portion is thicker than the second portion;

a hard mask layer disposed on the second portion of the metal gate;

a gate dielectric layer disposed between the first portion of the metal gate and the active area;

a source doping region disposed on a first side of the metal gate;

a drain doping region disposed on an opposing second side of the metal gate a second inter-layer dielectric (ILD) layer covering the first ILD layer, the hard mask layer, and the metal gate; and a contact plug embedded in the second ILD layer and extending into the hard mask layer to electrically contact with the second portion of the metal gate.

2. The semiconductor transistor structure according to claim 1, wherein the hard mask layer comprises a silicon nitride layer.

3. The semiconductor transistor structure according to claim 1, wherein the metal gate comprises a metal filling layer and a work function metal (WFM) layer.

4. The semiconductor transistor structure according to claim 3, wherein the metal filling layer comprises a tungsten layer.

5. The semiconductor transistor structure according to claim 3, wherein the hard mask layer is in direct contact with the metal filling layer.

6. The semiconductor transistor structure according to claim 1, wherein the hard mask layer has a top surface that is coplanar with a top surface of the first portion of the metal gate.

7. The semiconductor transistor structure according to claim 1 wherein the contact plug comprises tungsten.

8. The semiconductor transistor structure according to claim 1, wherein the second portion of the metal gate has a width greater than or equal to 0.07 micrometers.

9. A method of forming a semiconductor transistor structure, comprising:

providing a semiconductor substrate having an active area and a trench isolation region surrounding the active area;

forming a first inter-layer dielectric (ILD) layer covering the semiconductor substrate;

forming a metal gate embedded in the first ILD layer and overlying the active area and the trench isolation region, wherein the metal gate comprises a first portion disposed directly above the active area and a second portion disposed directly above the trench isolation region, wherein the first portion is thicker than the second portion;

forming a source doping region on a first side of the metal gate;

forming a drain doping region on an opposing second side of the metal gate;

forming a hard mask layer on the second portion of the metal gate; and forming a gate dielectric layer between the first portion of the metal gate and the active area;

forming a second inter-layer dielectric (ILD) layer covering the first ILD layer, the hard mask layer, and the metal gate; and forming a contact plug embedded in the second ILD layer and extending into the hard mask layer to electrically contact with the second portion of the metal gate.

10. The method according to claim 9, wherein the hard mask layer comprises a silicon nitride layer.

11. The method according to claim 9, wherein the metal gate comprises a metal filling layer and a work function metal (WFM) layer.

12. The method according to claim 11, wherein the metal filling layer comprises a tungsten layer.

13. The method according to claim 11, wherein the hard mask layer is in direct contact with the metal filling layer.

14. The method according to claim 9, wherein the hard mask layer has a top surface that is coplanar with a top surface of the first portion of the metal gate.

15. The method according to claim 9 wherein the contact plug comprises tungsten.

16. The method according to claim 9, wherein the second portion of the metal gate has a width greater than or equal to 0.07 micrometers.

* * * * *